United States Patent
Fabre et al.

(10) Patent No.: US 8,605,210 B2
(45) Date of Patent: Dec. 10, 2013

(54) OPTICAL MODULE FOR A CELLULAR PHONE

(75) Inventors: Sebastien Fabre, Villeneuve-Loubet (FR); Rainer Fischer, Jena (DE); Mathias Schulz, Weimer (DE)

(73) Assignee: Jabil Circuit, Inc., St. Petersburg, FL (US)

( * ) Notice: Subject to any disclaimer, the term of this patent is extended or adjusted under 35 U.S.C. 154(b) by 0 days.

(21) Appl. No.: 12/996,909

(22) PCT Filed: Sep. 10, 2009

(86) PCT No.: PCT/EP2009/006582
§ 371 (c)(1),
(2), (4) Date: Dec. 8, 2010

(87) PCT Pub. No.: WO2010/028832
PCT Pub. Date: Mar. 18, 2010

(65) Prior Publication Data
US 2011/0086669 A1   Apr. 14, 2011

(30) Foreign Application Priority Data
Sep. 12, 2008  (DE) .......................... 10 2008 047 088

(51) Int. Cl.
*H04N 5/225*  (2006.01)
(52) U.S. Cl.
USPC .......................................... 348/374; 348/373
(58) Field of Classification Search
None
See application file for complete search history.

(56) References Cited

U.S. PATENT DOCUMENTS

| | | | | |
|---|---|---|---|---|
| 2001/0050721 A1* | 12/2001 | Miyake | ......................... | 348/374 |
| 2002/0044215 A1* | 4/2002 | Takagi et al. | .................. | 348/374 |
| 2003/0218251 A1* | 11/2003 | Seo | ................. | 257/737 |
| 2003/0223008 A1* | 12/2003 | Kim et al. | ..................... | 348/340 |
| 2006/0243884 A1* | 11/2006 | Onodera et al. | ............ | 250/208.1 |
| 2007/0217786 A1* | 9/2007 | Cho et al. | ........................ | 396/542 |
| 2007/0253697 A1* | 11/2007 | Kim et al. | ..................... | 396/275 |
| 2007/0274671 A1 | 11/2007 | Quaderer | | |
| 2008/0079829 A1* | 4/2008 | Choi et al. | .................... | 348/294 |

FOREIGN PATENT DOCUMENTS

| | | |
|---|---|---|
| DE | 10 2006 036 049 | 2/2008 |
| DE | 60 2004 009 753 | 3/2008 |
| EP | 0 774 888 | 5/1997 |

\* cited by examiner

*Primary Examiner* — James Hannett
*Assistant Examiner* — Dwight C Tejano
(74) *Attorney, Agent, or Firm* — Price Heneveld LLP

(57) ABSTRACT

The invention relates to an optical module for a cellular phone having an image sensor comprising a light sensitive upper side for detecting and converting optical signals into electrical signals, an imaging device for imaging the optical signals on the image sensor, and a circuit board comprising an upper side and a lower side electrically and mechanically connected to the image sensor. In order to create a particularly flat optical module, for example for integration into a cellular phone, the invention provides that the circuit board has a recess in which the image sensor is disposed such that a lower side of the image sensor is substantially located at the same height as the lower side of the circuit board.

16 Claims, 3 Drawing Sheets

Stand der Technik

OPTICAL MODULE FOR A CELLULAR PHONE

FIELD OF THE INVENTION

The invention relates to optical modules for electronic recording of optical signals, and in particular, but not exclusively, to an optical module for mobile telephones.

BACKROUND OF THE INVENTION

Optical modules for electronic cameras, in particular for mobile telephones, typically include an image sensor with a light-sensitive upper side for capturing and converting optical signals into electrical signals. In order to optimally use the frequently weak optical signals, an imaging device for imaging the optical signals onto the image sensor is typically arranged in front of the image sensor. The image sensor is electrically and mechanically connected with a printed circuit board, wherein the printed circuit board may include one or more active and passive electronic circuits for processing the electrical signals from the image sensor.

Conventional camera modules have a high profile. The main reason is that the printed circuit board is used as a mechanical support for the module. The printed circuit board is typically made from FR4 or a similar material. The printed circuit board can also be made of a ceramic material. Due to the employed material, the printed circuit board has typically a thickness in a range between 0.3 and 0.5 mm. Because the optical module is mounted on top of the printed circuit board, the total thickness of the optical module cannot be reduced below a certain minimum dimension.

German publication DE 60 2004 009 753 T2 discloses an optical module with a printed circuit board, a photo detector and a lens assembly. The spacer means disposed between the photo detector and the printed circuit board have four isolation blocks attached at four corners of the bottom surface of the photo detector. A structure of this type prevents a further reduction of the profile and is therefore problematic with the increasingly thinner mobile telephones. It is an object of the present invention to provide a particularly thin optical module, for example for integration with a mobile telephone.

Features and advantages of the invention are described in the following description of preferred embodiments, wherein reference is made to the appended drawing.

Figure 1:
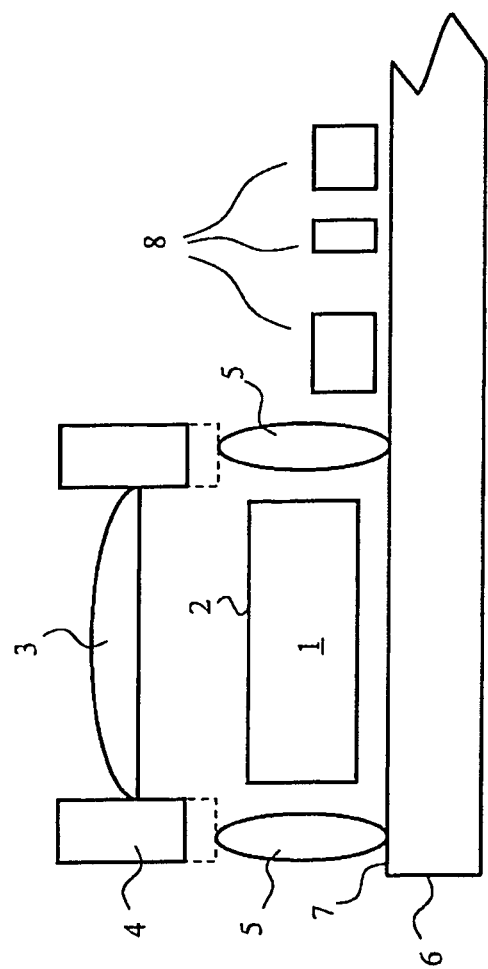
FIG. 1 shows schematically in cross-section the structure of a conventional optical module for a mobile telephone.

The drawings are not to scale and identical elements or elements having the same function are provided with identical reference symbols, unless otherwise noted. Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention

DETAILED DESCRIPTION OF PREFERRED EMBODIMENT

Before describing in detail embodiments that are in accordance with the present invention, it should be observed that the embodiments reside primarily in combinations of apparatus components related to an optical module for a mobile telephone. Accordingly, the apparatus components and any method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of an optical module used with a mobile telephone as described herein.

FIG. 1 shows schematically a conventional optical module in cross-section. The optical module is preferably used as a photographic unit of a mobile telephone and includes an image sensor 1 having a light-sensitive upper side 2 for capturing optical signals and converting the optical signals into electrical signals. The optical signals are imaged onto the image sensor 1 by an imaging device. The imaging device includes a lens or a lens group 3 and an optical focusing device 4. The focusing device 4 is used as a support for the lens group 3 and for adjusting the working distance of the lens group 3 from the light-sensitive top surface 2 of the image sensor 1.

The electrical signals produced by the image sensor 1 are further processed by an electronic circuit and prepared for storage on a storage medium (not illustrated). In the illustrated embodiment of the invention, the circuit is disposed on a printed circuit board 6, wherein the electronic components 8 are arranged on the upper side 7 of the printed circuit board 6. These components form an electronic circuit for processing the electrical signals from the image sensor 1. A skilled artisan will appreciate that the electronic components 8 can also be attached on both sides of the printed circuit board 6 and that a single integrated circuit may be provided instead of several components 8. Additional embodiments are known to a skilled artisan and will not be discussed further, although the additional discussion is not limited to the aforedescribed structure.

For adjusting the correct distance between the imaging optics 3 with the focusing device 4, it is typically necessary in conventional devices to provide spacers 5 between the printed circuit board 6 and the focusing device 4. These spacers 5 can hereby support the image sensor 1 either fully along an edge or at points in several sections.

The image sensor 1 is typically connected by way of (unillustrated) bonding wires with the printed circuit board 6, and hence also with the components 8 disposed on the printed circuit board. The structure of the optical module according to FIG. 1 has the disadvantage that its profile cannot be reduced to just any desired height. This disadvantage is eliminated with the structure of the optical module according to an embodiment the invention.

Figure 2:
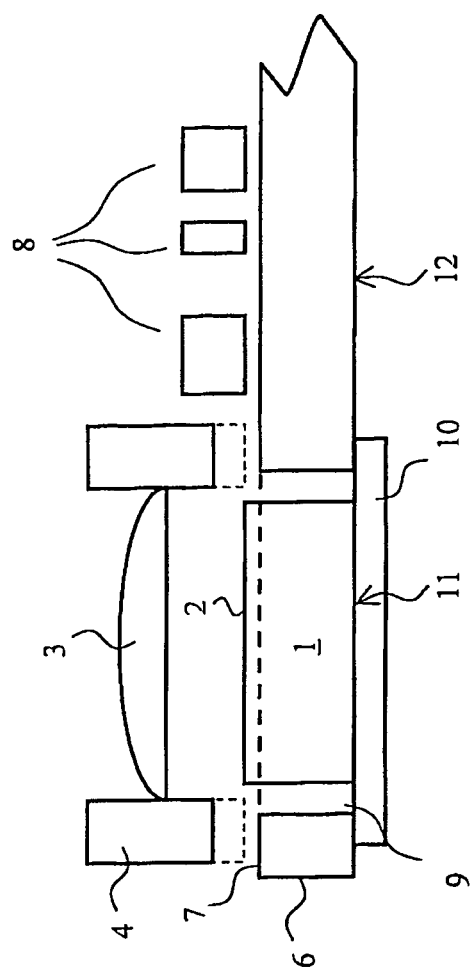
FIG. 2 shows schematically in cross-section the structure of an optical module according to the invention for a mobile telephone.

FIG. 2 shows schematically the structure of an embodiment of the optical module according to the invention. The electronic components 8 for electronic processing of the signals from the image sensor 1 are located on the upper side 7 of the printed circuit board 6. Imaging optics 3 which images optical information onto the light-sensitive top surface 2 of the image sensor 1 is arranged in a focusing device 4 located in front of the image sensor 1. Unlike in the illustration in FIG. 1, the printed circuit board 6 according to FIG. 2 has an opening 9 located at the height of the image sensor 1. The image sensor 1 is arranged in this opening 9, so that the image sensor is recessed with respect to the upper side 7 of the printed circuit board. More particularly, the image sensor 1 is lowered until its lower side 11 is substantially at the same height as the lower side 12 of the printed circuit board.

This arrangement is attained in particular by arranging on the lower side 12 of the printed circuit board a support plate 10 which covers the opening 9 of the printed circuit board. The image sensor 1 is subsequently attached on this support plate 10. It would basically be also feasible to place the support plate 10 still lower, so that the image sensor 1 can be lowered even further with respect to the printed circuit board; however, in practice, the support plate 10 can be easily attached on the lower side 12 of the printed circuit board, which is advantageous. The support plate 10 itself may also have an (unillustrated) recess in which the image sensor 1 is received, or the support plate 10 can curve downwards. The material of the support plate 10 is preferably metal or ceramic. By selecting this material, the thickness of the support plate 10 can be reduced to 10 to 100 μm, thereby minimizing the profile taken up by the optical module towards the bottom.

In particular, the printed circuit board 6 is a commercially available multilayer printed circuit board having a thickness of approximately 0.3 to 0.5 mm (i.e., significantly thicker than the support plate 10 according to the invention). In an (unillustrated) preferred embodiment of the invention, the opening 9 does not extend through the entire thickness of the multilayer printed circuit board 6, but instead only a few or several top players of the printed circuit board 6 are recessed at the height of the image sensor 1, so that the image sensor 1 can be lowered at this location into the printed circuit board 6. The remaining layers of the printed circuit board 6 at the height of the image sensor 1 then form the support plate 10 according to the invention. In other words, the support plate 10 includes one or more layers of the multilayer printed circuit board. The number of layers which are recessed in the printed circuit board or which are left unchanged depends on the stability requirements for the structure. The support plate 10 has preferably a predetermined rigidity which depends on these stability requirements. Conversely, the printed circuit board 6 for the electronic circuit may, for example, be flexible. However, it should be taken into consideration that contacting the image sensor is more complex with a flexible printed circuit board than with a rigid printed circuit board made, for example, of FR4 or ceramic.

Figure 3:
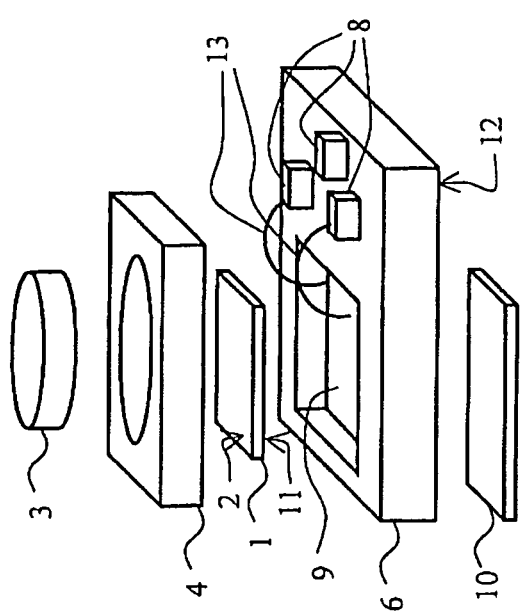
FIG. 3 shows schematically in a perspective view the structure of an embodiment of the optical module according to the invention for a mobile telephone.

FIG. 3 illustrates is an exploded view illustrating the structure of the optical module. Light is incident onto the light-sensitive surface 2 of the image sensor 1 through the imaging device 3. The distance between the imaging device 3 and the light-sensitive surface 2 of the sensor 1 is adjusted with the focusing device 4. The sensor is arranged in the opening 9 in the printed circuit board 6. The sensor 1 is hereby supported by the support plate 10 arranged on the opposite side 12 of the printed circuit board 6. The lower side 11 of the sensor 1 is then substantially at the same height as the lower side 12 of the printed circuit board 6. In a preferred embodiment of the invention, the image sensor 1 is a so-called COB image sensor, i.e., it is directly adhesively attached on the printed circuit board, in this case the support plate 10, without a housing and is subsequently connected (bonded) with the printed circuit board 6 by way of micro-wires (bonding wires) 13.

The invention is not limited to this embodiment. Instead of the image sensor with a COB structure, a flip-chip image sensor (not shown) can also be employed, which has contacts on the light-sensitive side 2 configured for direct connection with the lower side 12 of the printed circuit board 6. In this embodiment, the image sensor operates simultaneously as a stabilizing component.

Thus, according to an embodiment of the invention, a metal or ceramic plate is arranged on the lower side of the printed circuit board and used as mechanical support for the optical module, while simultaneously an opening is provided in the printed circuit board at the height of the optical module, so that the image sensor can be recessed in the printed circuit board, with the printed circuit board surrounding the image sensor. Contacts to the image sensor can be provided in a conventional manner by bonding.

According to an embodiment of the invention, the optical module is used with a cellular or mobile telephone. An image sensor has a light-sensitive upper side for capturing optical signals and converting the optical signals into electrical signals. An imaging device for imaging the optical signals is affixed onto the image sensor and a printed circuit board. The printed circuit board includes an upper side and with a lower side, which is electrically and mechanically connected with the image sensor. The printed circuit board includes an opening in which the image sensor is disposed such that a lower side of the image sensor is located essentially at the same height as the lower side of the printed circuit board.

Preferably, the optical module according to the invention has one or more of the following features: 1) a support plate covering the opening of the printed circuit board is arranged on the lower side of the printed circuit board, wherein the image sensor is affixed to the support plate; 2) the support plate is made from metal or a ceramic material; 3) the support plate has a thickness of 10 to 100 μm; 3) the printed circuit board is a multilayer printed circuit board, and the support plate includes at least one layer of the multilayer printed circuit board; and 4) the image sensor is a COB image sensor.

This solution in addition to its small profile offers a number of additional advantages. Because a continuous printed circuit board is eliminated, a metal or ceramic support plate made is used to directly affix an image. This ensures excellent heat transfer from the image sensor. In addition, with the module arranged with respect to the printed circuit board, a larger contact surface or footprint can be attained, which also contributes to the mechanical stability of the optical module.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. An optical module for a mobile telephone comprising:
   an image sensor having a light-sensitive upper side for capturing optical signals and converting the optical signals into electrical signals;
   an imaging device for imaging the optical signals onto the image sensor;
   a printed circuit board having an upper side and a lower side, which is electrically and mechanically connected with the image sensor; and
   wherein the printed circuit board has an opening in which the image sensor is arranged such that a lower side of the image sensor is located substantially at the same height as the lower side of the printed circuit board.

2. An optical module as in claim 1, further comprising:
   a support plate covering the opening of the printed circuit board and arranged on the lower side of the printed circuit board such that the image sensor is attached to the support plate.

3. An optical module as in claim 2, wherein the support plate is made from metal or ceramic.

4. An optical modular as in claim 2, wherein the support plate has a thickness in a range between 10 to 150 micrometers ($\mu$m).

5. An optical module as in claim 2, wherein the support plate includes at least one layer of a multilayer printed circuit board.

6. An optical module as in claim 1, wherein the printed circuit board is a multilayer printed circuit board.

7. An optical module as in claim 1, wherein the image sensor is a chip on board (COB) image sensor.

8. An optical module for a cellular telephone comprising:
   an image sensor having a light-sensitive upper side for capturing optical signals and converting the optical signals into electrical signals;
   an imaging device for imaging the optical signals onto the image sensor, and a first printed circuit board having an upper side and a lower side, which is electrically and mechanically connected with the image sensor;
   a support plate including a second printed circuit board for covering an opening in the first printed circuit board and arranged on the lower side of the first printed circuit board such that the image sensor is attached to the support plate; and
   wherein the printed circuit board has an opening in which the image sensor is arranged such that a lower side of the image sensor is located substantially at the same height as the lower side of the printed circuit board.

9. An optical module as in claim 8, wherein the support plate is made from metal or ceramic.

10. An optical modular as in claim 8, wherein the support plate has a thickness in a range between 10 to 150 micrometers ($\mu$m).

11. An optical module as in claim 8, wherein the first printed circuit board and second printed circuit board include multiple layers.

12. An optical module as in claim 8, wherein the image sensor is a chip on board (COB) image sensor.

13. An optical module for a cellular telephone comprising:
   a chip on board (COB) image sensor having a light-sensitive upper side for capturing optical signals and converting the optical signals into electrical signals;
   an imaging device for imaging the optical signals onto the image sensor, and a multilayer printed circuit board having an upper side and a lower side, which is electrically and mechanically connected with the image sensor;
   a support plate having a thickness in a range between 10 to 150 micrometers ($\mu$m) for covering an opening in the printed circuit board and arranged on the lower side of the printed circuit board such that the image sensor is attached to the support plate; and
   wherein the printed circuit board has an opening in which the image sensor is arranged such that a lower side of the COB image sensor is located substantially at the same height as the lower side of the printed circuit board.

14. An optical module as in claim 13, wherein the support plate is made from metal or ceramic.

15. An optical module as in claim 13, wherein the printed circuit board is a multilayer printed circuit board.

16. An optical module as in claim 13, wherein the support plate includes at least one layer of multilayer printed circuit board.

* * * * *